US008865540B2

(12) United States Patent
Calafut et al.

(10) Patent No.: US 8,865,540 B2
(45) Date of Patent: Oct. 21, 2014

(54) METHOD FOR FORMING A SCHOTTKY BARRIER DIODE INTEGRATED WITH A TRENCH MOSFET

(71) Applicant: Alpha and Omega Semiconductor Incorporated, Sunnyvale, CA (US)

(72) Inventors: Daniel Calafut, San Jose, CA (US); Yi Su, Cupertino, CA (US); Jongoh Kim, Cupertino, CA (US); Hong Chang, Cupertino, CA (US); Hamza Yilmaz, Saratoga, CA (US); Daniel S. Ng, Campbell, CA (US)

(73) Assignee: Alpha and Omega Semiconductor Incorporated, Sunnyvale, CA (US)

( * ) Notice: Subject to any disclaimer, the term of this patent is extended or adjusted under 35 U.S.C. 154(b) by 0 days.

(21) Appl. No.: 14/083,309

(22) Filed: Nov. 18, 2013

(65) Prior Publication Data
US 2014/0073098 A1    Mar. 13, 2014

Related U.S. Application Data

(63) Continuation of application No. 13/241,126, filed on Sep. 22, 2011, now Pat. No. 8,610,235.

(51) Int. Cl.
*H01L 29/872* (2006.01)
*H01L 21/8234* (2006.01)
(Continued)

(52) U.S. Cl.
CPC .... *H01L 21/823487* (2013.01); *H01L 29/7813* (2013.01); *H01L 29/872* (2013.01); *H01L 29/407* (2013.01); *H01L 29/47* (2013.01); *H01L 29/0649* (2013.01); *H01L 27/0629* (2013.01); *H01L 29/7806* (2013.01); *H01L 29/66143* (2013.01); *H01L 29/0653* (2013.01); *H01L 29/41766* (2013.01); *H01L 27/06* (2013.01); *H01L 29/456* (2013.01); *H01L 29/0878* (2013.01)
USPC .............. 438/237; 257/334; 257/E29.662; 257/E29.338; 257/E21.616

(58) Field of Classification Search
CPC ... H01L 27/06; H01L 29/872; H01L 27/0629; H01L 29/66143; H01L 29/407; H01L 29/7806; H01L 29/7813; H01L 29/47; H01L 29/456; H01L 29/0649; H01L 29/0653; H01L 29/0878; H01L 29/41776; H01L 19/78; H01L 21/8234
See application file for complete search history.

(56) References Cited

U.S. PATENT DOCUMENTS

2008/0042172 A1*  2/2008  Hirler et al. .............. 257/288
2011/0312166 A1* 12/2011  Yedinak et al. ............ 438/488
(Continued)

*Primary Examiner* — David Vu
*Assistant Examiner* — Mouloucoulaye Inoussa
(74) *Attorney, Agent, or Firm* — Van Pelt, Yi & James LLP

(57) ABSTRACT

A method for forming a Schottky diode including forming first and second trenches in a semiconductor layer, forming a thin dielectric layer lining sidewalls of the first and second trenches; forming a trench conductor layer in the first and second trenches where the trench conductor layer fills a portion of each of the first and second trenches and being the only one trench conductor layer in the first and second trenches; forming a first dielectric layer in the first and second trenches to fill the remaining portions of the first and second trenches; and forming a Schottky metal layer on a top surface of the lightly doped semiconductor layer between the first trench and the second trench to form a Schottky junction. The Schottky diode is formed with the Schottky metal layer as the anode and the lightly doped semiconductor layer between the first and second trenches as the cathode.

27 Claims, 10 Drawing Sheets

(51) Int. Cl.
  *H01L 29/78* (2006.01)
  *H01L 29/40* (2006.01)
  *H01L 27/06* (2006.01)
  *H01L 29/66* (2006.01)
  *H01L 29/47* (2006.01)
  *H01L 29/06* (2006.01)
  *H01L 29/417* (2006.01)
  *H01L 29/45* (2006.01)
  *H01L 29/08* (2006.01)

(56) References Cited

U.S. PATENT DOCUMENTS

2012/0248530 A1\* 10/2012 Lui et al. ................ 257/334
2014/0073098 A1\* 3/2014 Calafut et al. ............ 438/237

\* cited by examiner

METHOD FOR FORMING A SCHOTTKY BARRIER DIODE INTEGRATED WITH A TRENCH MOSFET

CROSS REFERENCE TO OTHER APPLICATIONS

This application is a continuation of co-pending U.S. patent application Ser. No. 13/241,126, entitled TRENCH MOSFET WITH INTEGRATED SCHOTTKY BARRIER DIODE, filed Sep. 22, 2011 which is incorporated herein by reference for all purposes.

FIELD OF THE INVENTION

The invention relates to semiconductor devices and, in particular, to a trench MOSFET device with a Schottky barrier diode integrated therein.

DESCRIPTION OF THE RELATED ART

A Schottky junction is characterized by a lower energy barrier (for free carriers) than a PN diode junction, and unipolar current conduction, as opposed to bipolar current conduction as in the PN diode case. As such, Schottky diodes begin current conduction at a lower forward voltage than a typical PN junction diode, but also have reversed bias leakage currents that are higher than a typical PN junction diode. Because Schottky diodes are unipolar devices, they typically switch faster than a PN junction diode.

Schottky diodes are typically used in electronic applications to provide rectification. For instance, in applications where a power converter implements synchronous rectification, the power converter uses a power MOSFET for the high side switch and another power MOSFET as the low-side switch where the two power MOSFETs operate to regulate the delivery of current to the load. In operation, both switches are off before one is being turned on. During the time when both switches are turned off, the body diode of the power MOSFET conducts current. However, in order to improve conversion efficiency, a Schottky diode is often added in parallel with the MOSFET body diode, as shown in FIG. 1. An N-type power MOSFET M1 has a body diode D1 formed by the P-type body region as the anode and the N-type drain region as the cathode. To improve the performance of the power MOSFET M1, a Schottky diode SD1 is connected in parallel with the body diode D1. The anode of the Schottky diode SD1 is electrically connected to the source terminal of the power MOSFET M1 or the anode of the body diode D1. The cathode of the Schottky diode SD1 is electrically connected to the drain terminal of the power MOSFET M1 or the cathode of the body diode D1. The Schottky diode SD1 has a lower forward bias voltage than the body diode D1 and thus reduces the forward voltage drop as well as improves recovery time.

SUMMARY OF THE INVENTION

According to one embodiment of the present invention, a Schottky diode includes a semiconductor substrate of a first conductivity type; a semiconductor layer of the first conductivity type formed on the semiconductor substrate; first and second trenches formed in the semiconductor layer where the first and second trenches are lined with a thin dielectric layer and being filled partially with a trench conductor layer and remaining portions of the first and second trenches are filled with a first dielectric layer; and a Schottky metal layer formed on a top surface of the semiconductor layer between the first trench and the second trench. The Schottky diode is formed with the Schottky metal layer as the anode and the semiconductor layer between the first and second trenches as the cathode. The trench conductor layer in each of the first and second trenches is electrically connected to the anode of the Schottky diode.

According to another aspect of the present invention, a semiconductor device including a field effect transistor and a Schottky diode includes a semiconductor substrate of a first conductivity type; a semiconductor layer of the first conductivity type formed on the semiconductor substrate; first and second trenches formed in the semiconductor layer where the first and second trenches are lined with a thin dielectric layer and being filled with a first trench conductor layer and remaining portions of the first and second trenches are filled with a first dielectric layer; a Schottky metal layer formed on a top surface of the semiconductor layer between the first trench and the second trench; a third trench formed in the semiconductor layer where the third trench is lined with the thin dielectric layer and being filled with the first trench conductor layer and a second trench conductor layer, the first trench conductor layer being insulated from the second trench conductor layer by an inter-layer dielectric layer and the first trench conductor layer filling a portion of the third trench and the second trench conductor layer extending from the inter-layer dielectric to near a top surface of the third trench; a first well region of a second conductivity type formed in a top portion of the semiconductor layer adjacent the third trench where the first well region extends to a depth near a bottom edge of the second trench conductor layer formed in the third trench; and a heavily doped source region of the first conductivity type formed in the first well region adjacent to the sidewall of the third trench.

The Schottky diode is formed with the Schottky metal layer as the anode and the semiconductor layer between the first and second trenches as the cathode. The field effect transistor is formed with the heavily doped N-type semiconductor substrate as a drain electrode, the second trench conductor layer in the third trench as the gate electrode, the first well region as the body region, the heavily doped source region as the source electrode, the first trench conductor layer in the third trench as a gate shielding electrode. The first trench conductor layer in the third trench is electrically connected to the source electrode and the first trench conductor layer in each of the first and second trenches are electrically connected to the anode of the Schottky diode.

The present invention is better understood upon consideration of the detailed description below and the accompanying drawings.

DETAILED DESCRIPTION OF THE PREFERRED EMBODIMENTS

In accordance with the principles of the present invention, a Schottky diode is integrated into a trench MOSFET structure by utilizing mesas bordered by trenches that are only partially filled with a trench conductor where the trench conductor is electrically connected to the anode of the Schottky diode. In this manner, the standard fabrication process for the trench MOSFET device can be used to form a "trench" Schottky diode to allow the seamless integration of the Schottky diode into the trench MOSFET device structure.

Figure 1:
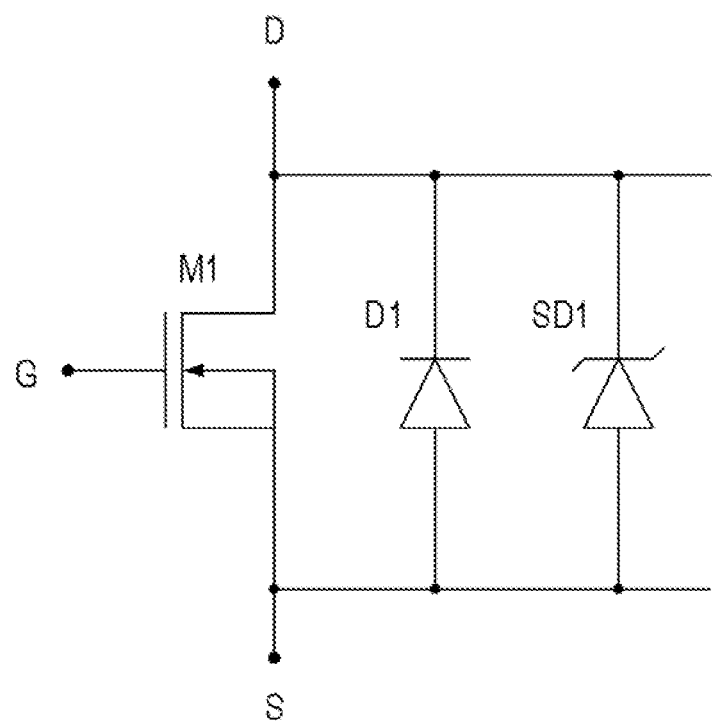
FIG. 1 is a circuit diagram illustrating the parallel connection of a Schottky diode with a power MOSFET and the body diode of the power MOSFET.
Figure 2:
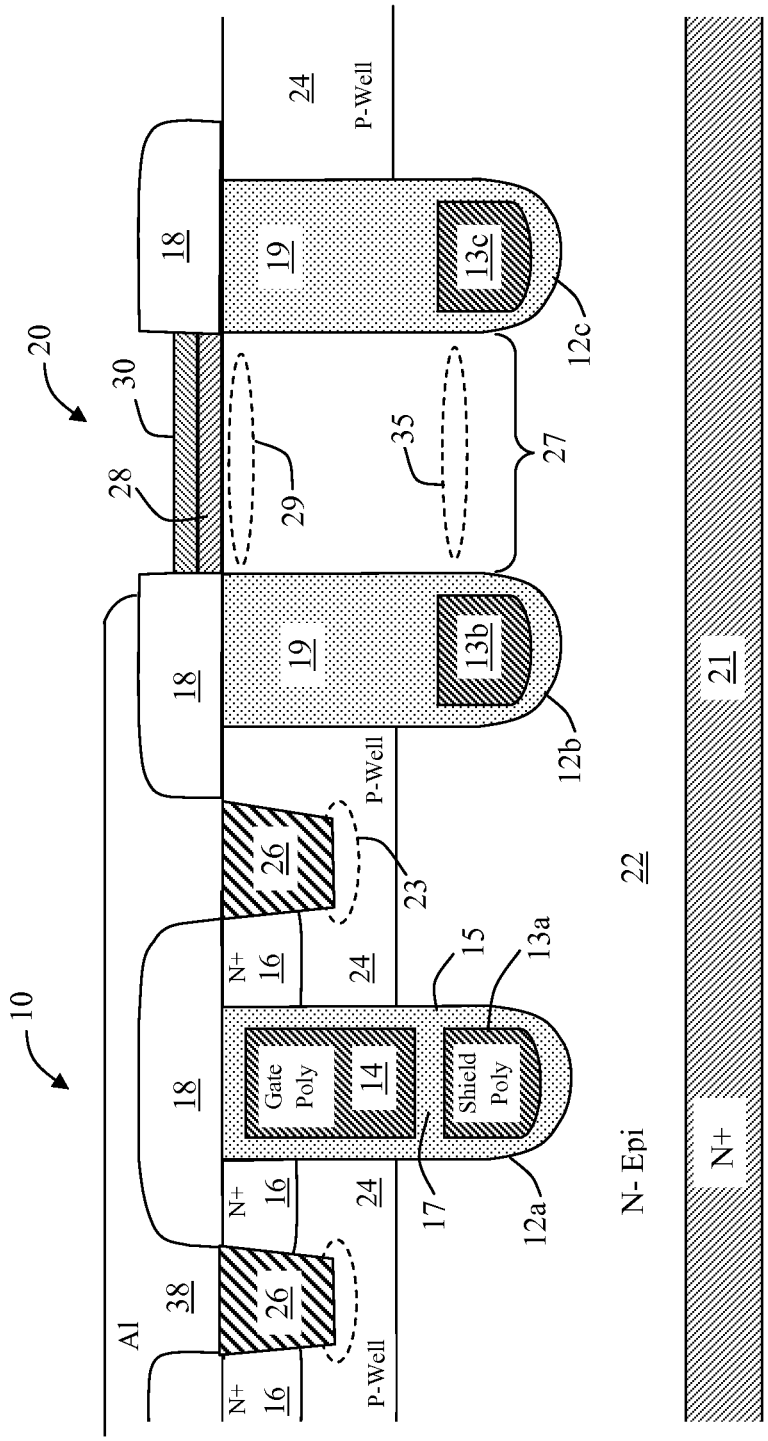
FIG. 2 is a cross-sectional view of a trench MOSFET device with an integrated Schottky diode according to one embodiment of the present invention.

FIG. 2 is a cross-sectional view of a trench MOSFET device with an integrated Schottky diode according to one embodiment of the present invention. Referring to FIG. 2, a trench MOSFET (metal-oxide-silicon field effect transistor) device 10 and a trench Schottky diode 20 are formed on a semiconductor body. In the present illustration, the semiconductor body includes an N-type epitaxial layer 22 formed on a heavily doped N+ substrate 21. In other embodiments, the semiconductor body may include a P-type semiconductor substrate with the P-type epitaxial layer formed thereon. The exact structure of the semiconductor body is not critical to the practice of the present invention. Trenches 12 (including trenches 12a to 12c) are formed in the N-type epitaxial layer 22 to define mesas in which diffusion regions are to be formed. The walls of the trenches 12a-12c are lined with a dielectric layer 15, such as a silicon oxide layer.

A first trench conductor layer 13 is formed in bottom portions of the trenches 12. More specifically, the first trench conductor layers 13a to 13c are formed in each of the trenches 12a to 12c. In embodiments of the present invention, the first trench conductor layer 13 is a polysilicon layer. An inter-poly dielectric layer 17 is formed on the first trench conductor layer. Then, in trench 12a associated with the trench MOSFET device 10, a second trench conductor layer 14 is formed above the inter-poly dielectric layer 17. In embodiments of the present invention, the second trench conductor layer 14 is a polysilicon layer. The second trench conductor layer is sometimes referred to as the gate conductor layer, a gate poly layer, or a gate electrode, as it functions as the gate conductor of the MOSFET device. The trenches 12b and 12c, bordering the mesa in which the trench Schottky diode 20 is to be form, are not filled with the second conductor layer 14 but instead the remaining portions of the trenches are filled with a dielectric layer 19, such as a silicon oxide layer. As a result, trenches 12b and 12c are only partially filled with a trench conductor layer.

P-wells 24 are formed in the mesas in which the trench MOSFET device is to be formed. For instance, P-well 24 is formed in the mesa adjacent trench 12a and between trenches 12a and 12b where the trench MOSFET device 10 is to be formed. P-well 24 extends to at least near the bottom of the gate poly layer in the adjacent trench 12a. The mesa between trenches 12b and 12c in which the trench Schottky diode 20 is to be formed do not receive the P-well implants and thus remains lightly doped N-type with the doping concentration of the N-type epitaxial layer. The P-wells 24 form the body region of the trench MOSFET device with the N-type epitaxial layer 22 forming the drain region. The N+ substrate 21 forms the backside drain electrode of the trench MOSFET device. Heavily doped N+ regions 16 are formed at the top portions of the mesas in which the trench MOSFET device is to be formed. Thus, heavily doped N+ regions 16 are formed in the mesa between trenches 12a and 12b and in the mesa adjacent trench 12a. A dielectric layer 18 is formed over the semiconductor body and is then patterned to form source-body contact openings in the mesas adjacent the N+ regions 16. The contact openings extend through the N+ source regions 16 into the P-well body regions 24. The contact openings are then filled with a source metal layer 26 to electrically connect the N+ source regions 16 to the P-well body regions 24. The source metal layer 26 filling the contact openings is sometimes referred to as a source contact plug 26 or a source plug 26 and the source metal layer 26 fills the contact opening made in the source regions 16 and the P-wells 24. In some embodiments, the source contact plug 26 is a tungsten plug. In some embodiments, before the source contact openings are filled, an optional P-type body contact diffusion region 23 may be formed by P+ implantation at the bottom of the source-body contact openings to improve the ohmic contact between the source plug and the P-well body regions 24.

After the source plugs 26 are formed, a metal layer 38 may be formed over the source plugs 26 and the dielectric layer 18 to form the electrical connection to the source regions and well regions. In some embodiments, the metal layer 38 is an aluminum layer. Subsequent dielectric or insulating layers (not shown) may be formed over the metal layer 38. Electrical contact to the drain region (N-type epitaxial layer 22) and to the first and second trench conductor layers may be formed in the mesas between the trenches, in a third dimension perpendicular to the cross-section shown in FIG. 2.

As thus formed, trench MOSFET device 10 includes a gate region formed in the gate poly layer 14, a source region formed in the N+ regions 16, a drain region formed in the N-type epitaxial layer 22 and a body region formed in the P-wells 24. MOSFET device 10 is a shielded gate trench MOSFET device as the first trench conductor layer 13 shields the gate poly layer 14 from high voltages. The first trench conductor layer is therefore sometimes referred to as a shield poly layer or a gate shielding electrode. The shield poly layer 13 is electrically connected to the source region of the MOSFET device 10. In some embodiments, the source region of the MOSFET device 10 is electrically connected to ground and the shield poly layer 13 is also electrically connected to the ground potential. The electrical connection to the shield poly layer 13 can be provided in the mesas between the trenches, in a third dimension perpendicular to the cross-section shown in FIG. 2.

Figure 3:
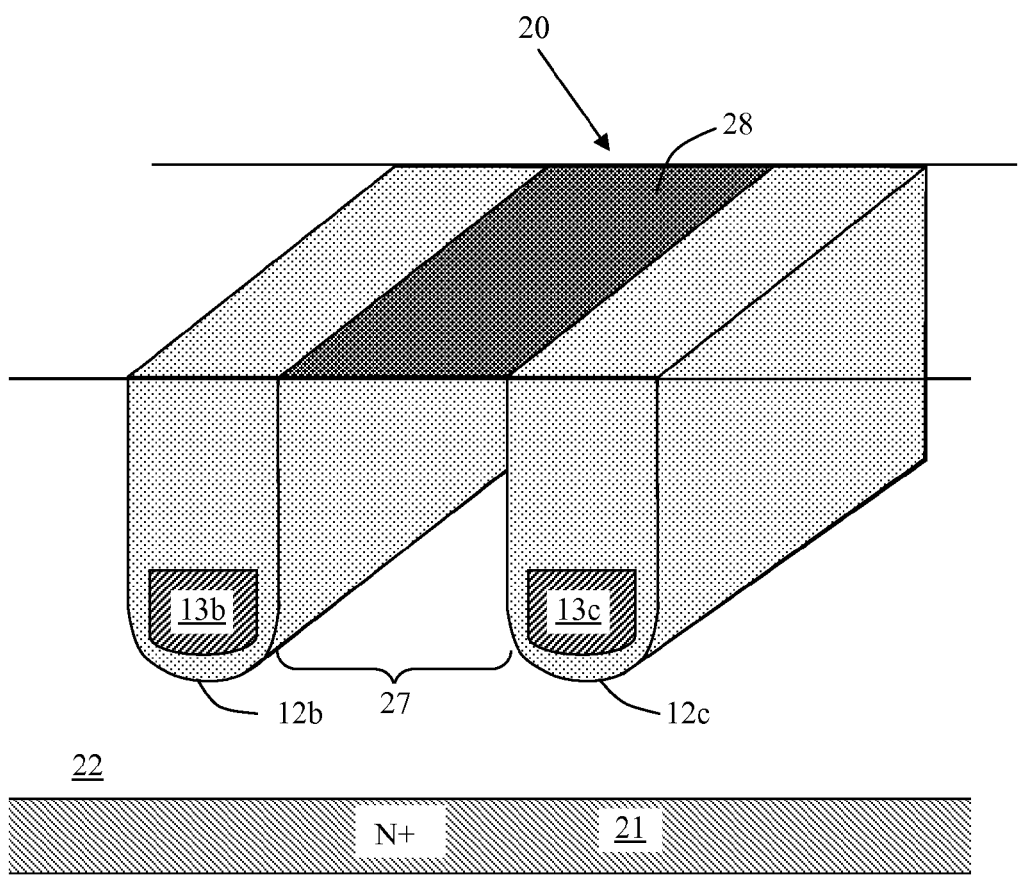
FIG. 3 is an isometric view of the trench Schottky diode of FIG. 2 illustrating the longitudinal axis of the trenches and the mesa in which the Schottky diode is formed.

The trench Schottky diode 20 is formed in a mesa 27 between trenches 12b and 12c. As described above, the mesa between trenches 12b and 12c does not receive the P-well implant and thus the mesa retains the doping level of the N-type epitaxial layer 22. To form the Schottky barrier diode, a Schottky metal layer 28 is formed on the surface of and in electrical contact with the mesa 27. FIG. 3 is an isometric view of the trench Schottky diode 20 illustrating the longitudinal axis of the trenches and the mesa in which the Schottky diode is formed. Referring to FIG. 3, a Schottky junction is formed at the metal-silicon junction of the Schottky metal layer 28 and the N-type epitaxial layer 22 at mesa 27. The mesa 27 forms the cathode of the Schottky diode while the Schottky metal layer 28 forms the anode of the Schottky diode. In embodiments of the present invention, additional metal layers may be formed on the Schottky metal layer 28 to improve the electrical conduction. In the present embodiment, a metal layer 30 is formed on top of the Schottky metal layer 28. In one embodiment, the metal layer 30 is a composite metal layer including a tungsten layer and an aluminum-silicon layer.

A salient feature of the trench Schottky diode 20 of the present invention is that the Schottky diode is formed in a mesa 27 bordered by trenches 12b, 12c that are only partially filled with a trench conductor layer and the trench conductor layer is electrically connected to the anode of the Schottky diode. In the present embodiment, the trenches 12b, 12c bordering the mesa 27 of the Schottky diode 20 are filled with only the shield poly layer 13b, 13c. The gate poly layer is not formed in trenches 12b, 12c. In this manner, the trench Schottky diode can be formed using the same fabrication process as the trench MOSFET with the modification of omitting the gate poly layer in the trenches 12b, 12c and modifying the P-well regions in mesa 27. In the present embodiment, the P-well region is omitted entirely in mesa 27. In alternate embodiments of the present invention, separate P-well regions may be formed interspersed or spaced apart along the longitudinal axis of the mesa where the Schottky diode is formed in N-type epitaxial layer between the P-well regions, as will be described in more detail below.

Another salient feature of the trench Schottky diode 20 of the present invention is that the same mesa width can be used for the trench MOSFET device and the trench Schottky diode. The trench Schottky diode does not require a narrowed mesa as in the case of the conventional devices. The use of a wider mesa width for the Schottky diode has the advantage of improving the series resistance of the Schottky diode, thereby improving the efficiency of the Schottky diode. In one embodiment, the Schottky diode is formed in a mesa that is also used for forming electrical contact to the shield poly layer. Accordingly, integrating the Schottky diode into the trench MOSFET device realizes efficient use of silicon real estate.

In another embodiment of the present invention, the trench conductor layer partially filing trenches 12b and 12c for the Schottky diode can be any other types of conductor layer, including metal and polysilicon. Furthermore, in embodiments of the present invention, the trenches 12b and 12c for the Schottky diode are filled with a trench conductor layer up to about half of the trench depth or less than half of the trench depth. In yet another embodiment, the trench conductor layer 13b, 13c in the trenches 12b and 12c for the Schottky diode can be electrically connected to the shield poly layer 13a of the trench MOSFET device 10 and be electrically connected to the source potential of the MOSFET device.

In some embodiments, a shallow compensation implant 29 is applied to the top surface of mesa 27 to adjust the barrier height at the surface of mesa 27 near the Schottky diode function. In embodiments of the present invention, the shallow compensation implant 29 is a P-type ion implantation into the N-Epitaxial layer 22. The depth and dose of the shallow compensation implant 29 are selected to adjust the forward bias voltage and the breakdown leakage current of the Schottky diode 20. The implant dose of the shallow compensation implant may or may not be sufficient to overcome the base doping concentration of the N-Epitaxial layer 22. Thus, the resulting implanted region at the surface of the mesa 27 may be converted to P-type or may remain N-type.

In some embodiments, one or more deep pocket compensation implants 35 are applied in the N-type epitaxial layer 22 away from the Schottky junction and deep in the mesa structure. The deep pocket compensation implants 35 may be N-type implants or P-type implants. The implant doses of the deep pocket compensation implants 35 are selected so that the base doping concentration of the N-Epitaxial layer 22 is not overcome by the deep pocket compensation implants. Thus, the resulting implanted regions remain N-type but with barrier height adjusted by the compensation implants. The deep pocket compensation implants 35 have the effect of controlling the current path of the Schottky diode to reduce leakage current.

Figure 4:
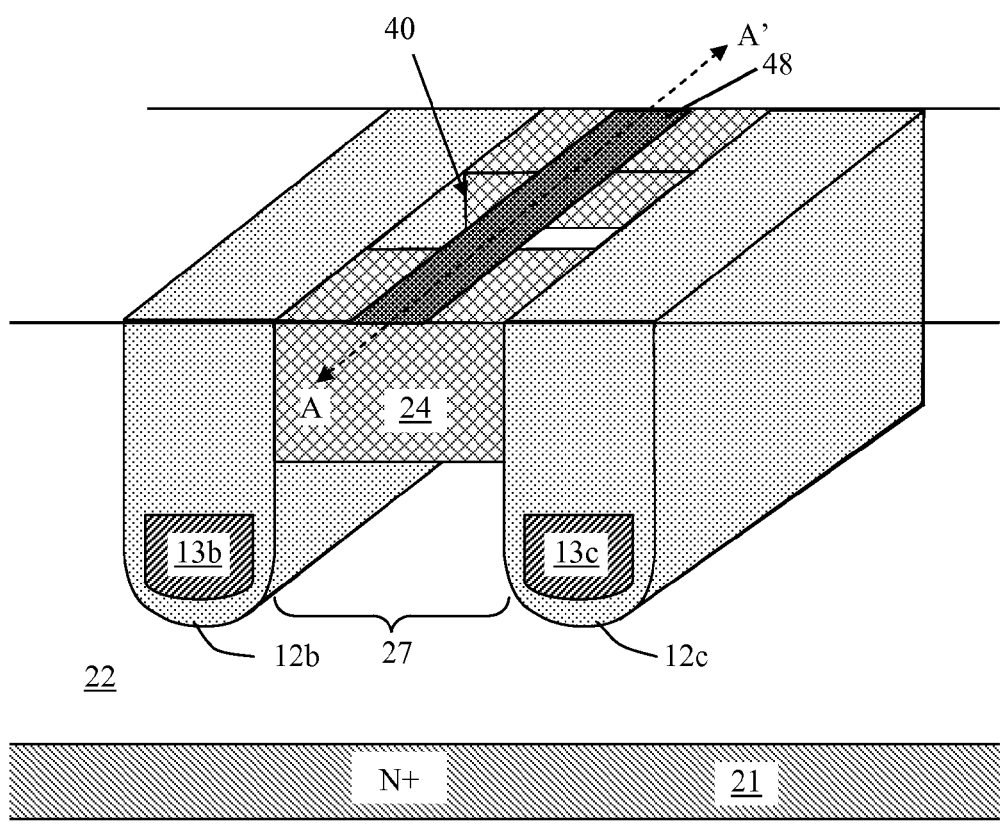
FIG. 4 is an isometric view of the trench Schottky diode according to a first alternate embodiment of the present invention.

FIG. 4 is an isometric view of the trench Schottky diode according to a first alternate embodiment of the present invention. Referring to FIG. 4, a trench Schottky diode 40 is formed in substantially the same manner as trench Schottky diode 20 described above. More specifically, trench Schottky diode 40 is formed in a mesa 27 between two trenches 12b and 12c that are only partially filled with a trench conductor layer 13b and 13c. In the present embodiment, P-well regions 24 are formed interspersed or spaced apart in mesa 27 along the longitudinal axis of the mesa. The longitudinal axis of the mesa is parallel to the longitudinal axis of the trenches. Therefore, the P-well regions 24 extend from one trench side wall to the next, such as from the sidewall of trench 12b to the sidewall of trench 12c. The P-well regions are spaced apart along the longitudinal axis of the mesa to form individual P-well regions along the length of the mesa. In the present embodiment, the Schottky metal layer 48 is formed as a long stripe overlying the P-well regions as well as the N-type epitaxial region in between the P-well regions. In one embodiment, the Schottky metal stripe 48 has a width narrower than the width of the mesa between two adjacent trenches 12b, 12c. As thus formed, the trench Schottky diode 40 is formed at a Schottky junction between the Schottky metal layer 48 and the N-type epitaxial layer 22 and as well as between a Schottky junction between the Schottky metal layer 48 and the P-well regions 24.

Figure 5:
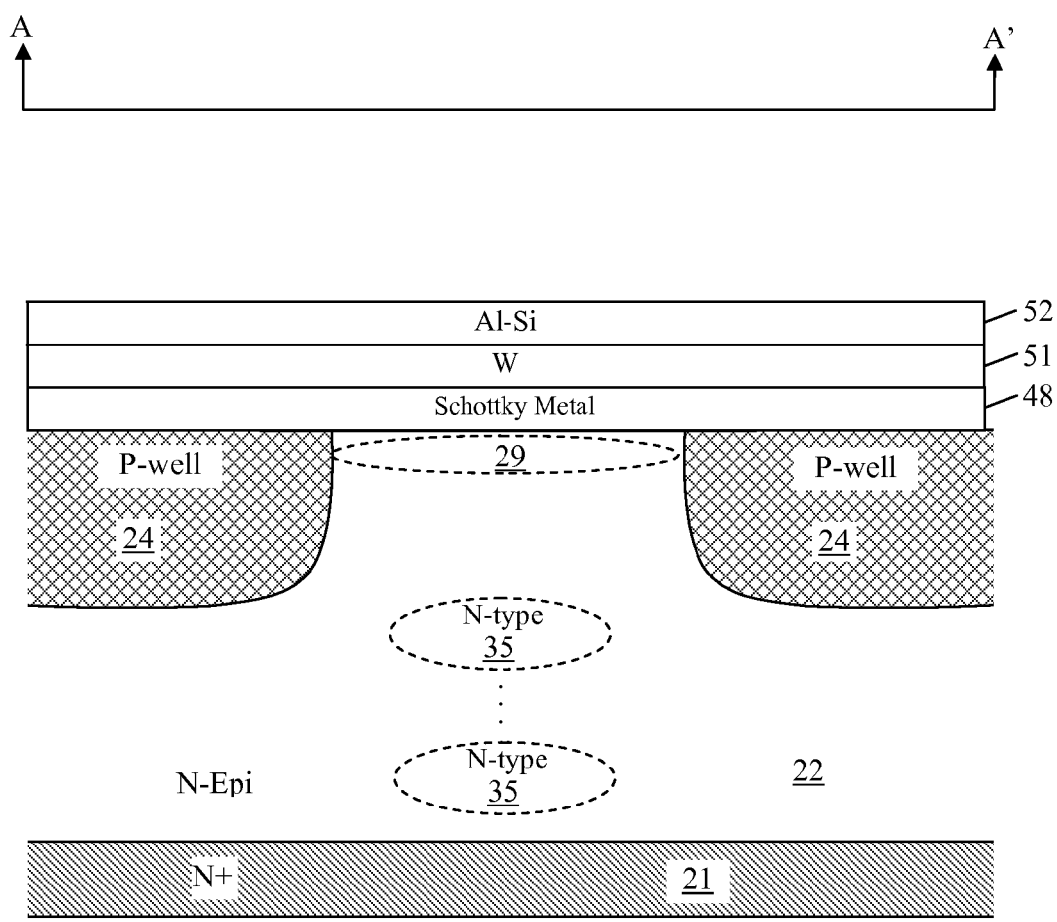
FIG. 5 is a cross-sectional view of the trench Schottky diode in FIG. 4 along the longitudinal line A-A' according to one embodiment of the present invention.

FIG. 5 is a cross-sectional view of the trench Schottky diode 40 along the longitudinal line A-A' according to one embodiment of the present invention. Referring to FIG. 5, the trench Schottky diode 40 is formed in the N-type epitaxial layer 22 between two trenches 12b, 12c (FIG. 4) and further between two adjacent P-well regions 24. The Schottky metal layer 48 is formed on the surface of the N-type epitaxial layer 22 and the P-well regions 24 to form the Schottky junction. In the present illustration, the Schottky metal overlies the P-well regions 24 as well as the N-type epitaxial layer 22. In one embodiment, the Schottky metal layer 48 is a titanium nitride (TiN) layer. Furthermore, in the some embodiments, additional metal layers are formed on the Schottky metal layer to reduce the resistance of the anode electrode of the Schottky diode. In the present embodiment, a tungsten (W) layer 51 is formed on the Schottky metal layer 48 and an aluminum-silicon (Al—Si) layer 52 is formed on the tungsten layer 51. An insulating layer (not shown) may be formed over the Schottky diode structure to provide insulation or passivation.

Forming the trench Schottky diode in between interspersed P-well regions provides many advantages. In particular, the P-well regions function to pinch off the Schottky diode current path, thereby limiting the leakage current. The P-well regions also enable control over the electric field at the surface of the mesa near the Schottky junction. The performance of the trench Schottky diode can thus be enhanced.

In embodiments of the present invention, compensation implants may be applied in the trench Schottky diode structure to enhance the electrical characteristics of the Schottky diode, as described above. In one embodiment, a shallow compensation implant 29 is applied to the top surface of the N-type epitaxial layer 22 near the Schottky junction. The shallow compensation implant 29 provides control over the forward bias voltage and breakdown leakage current of the Schottky diode. In some embodiments, one or more deep pocket compensation implants 35 are applied to the N-type epitaxial layer 22 away from the Schottky junction and deep in the mesa structure. The deep pocket compensation implants 35 have the effect of controlling the current path of the Schottky diode to reduce leakage current.

Figure 6:
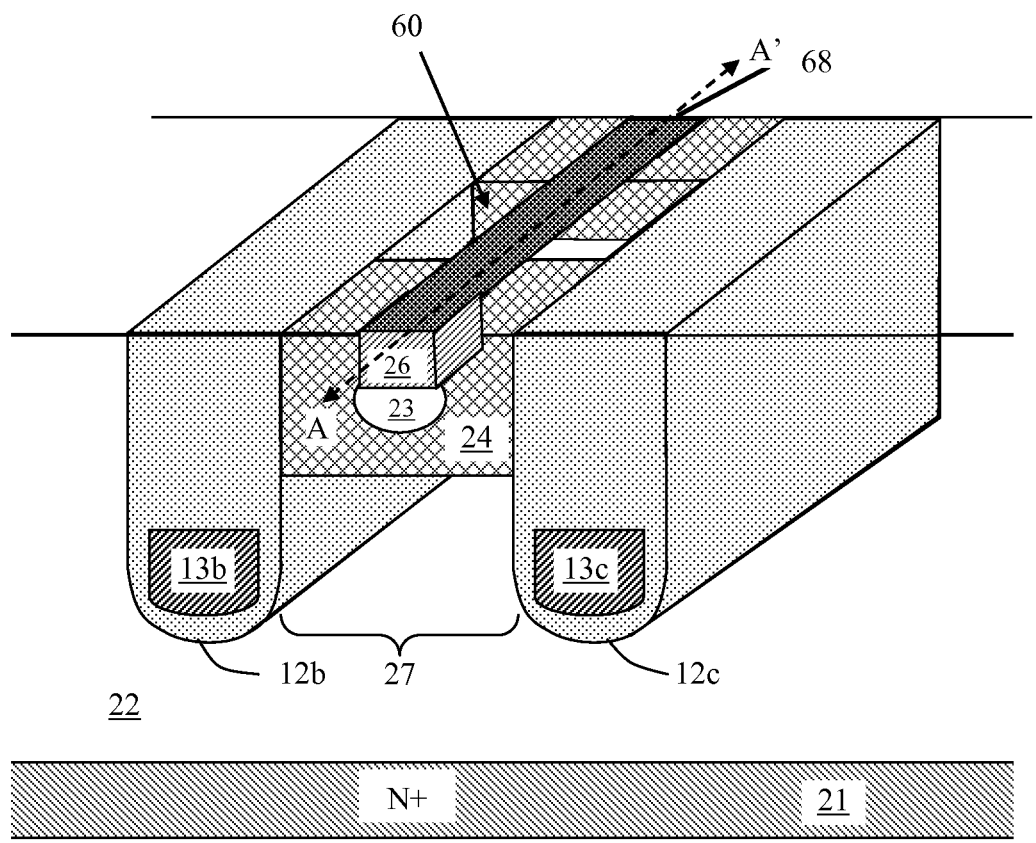
FIG. 6 is an isometric view of the trench Schottky diode according to a second alternate embodiment of the present invention.
Figure 7:
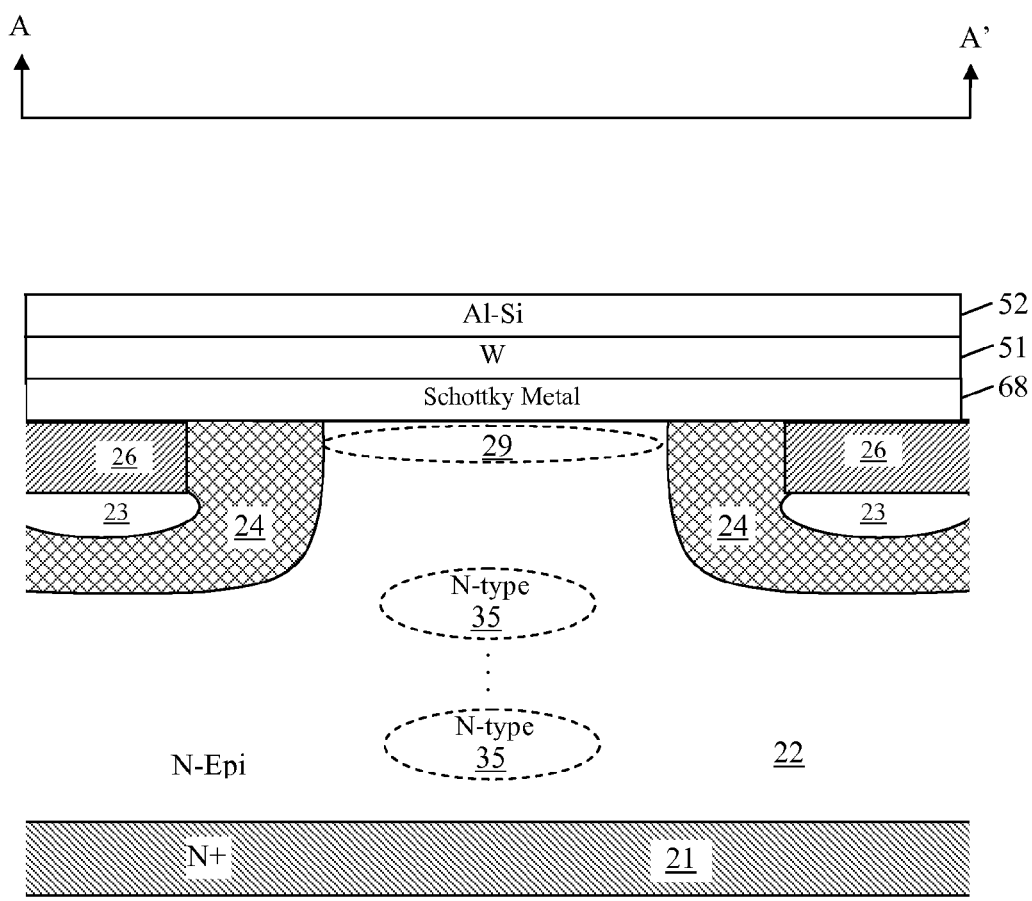
FIG. 7 is a cross-sectional view of the trench Schottky diode in FIG. 6 along the longitudinal line A-A' according to one embodiment of the present invention.

FIG. 6 is an isometric view of the trench Schottky diode according to a second alternate embodiment of the present invention. FIG. 7 is a cross-sectional view of the trench Schottky diode in FIG. 6 along the longitudinal line A-A' according to one embodiment of the present invention. Referring to FIGS. 6 and 7, a trench Schottky diode 60 is formed in substantially the same manner as trench Schottky diode 40 described above. More specifically, trench Schottky diode 60 is formed in a mesa 27 between two trenches 12b and 12c that are only partially filled with a trench conductor layer 13b and 13c. Furthermore, P-well regions 24 are formed interspersed in mesa 27 along the longitudinal axis of the mesa. In the present embodiment, source contact plugs 26 and optional P+ body contact diffusion regions 23 are formed in the P-well regions 24. The Schottky metal layer 68 is formed in a long stripe overlying the N-type epitaxial layer in mesa 27, the P-well regions 24, as well as the source plugs 26. The source contact plugs 26 enable an ohmic contact to be formed between the Schottky metal layer 68 and the P-well regions 24. In this manner, the P-well regions 24 are electrically connected to the same potential as the anode of the Schottky diode. Accordingly, the trench conductor layer 13b, 13c, the P-well region 24 and the anode are all connected to the same electrical potential. In some embodiments, the trench conductor layer 13b, 13c, the P-well region 24 and the anode are electrically connected to the ground potential. The trench conductor layer 13b, 13c and P-well regions thus formed provide shielding for the Schottky diode. In embodiments of the present invention, the anode of the Schottky diode may be in turn connected to the source of the trench MOSFET formed on the same semiconductor layer. Trench Schottky diode 60 may further include a shallow compensation implant 29 and one or more deep pocket compensation implants 35, as shown in FIG. 7 and described above.

Figure 8:
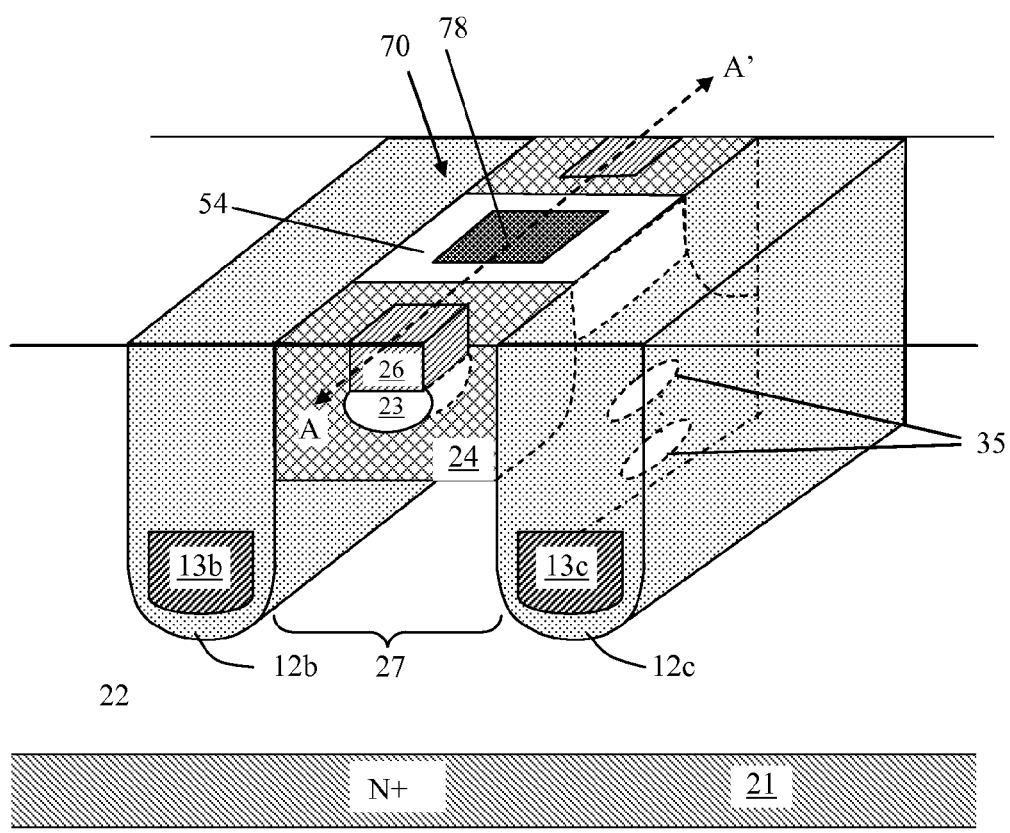
FIG. 8 is an isometric view of the trench Schottky diode according to a third alternate embodiment of the present invention.
Figure 9:
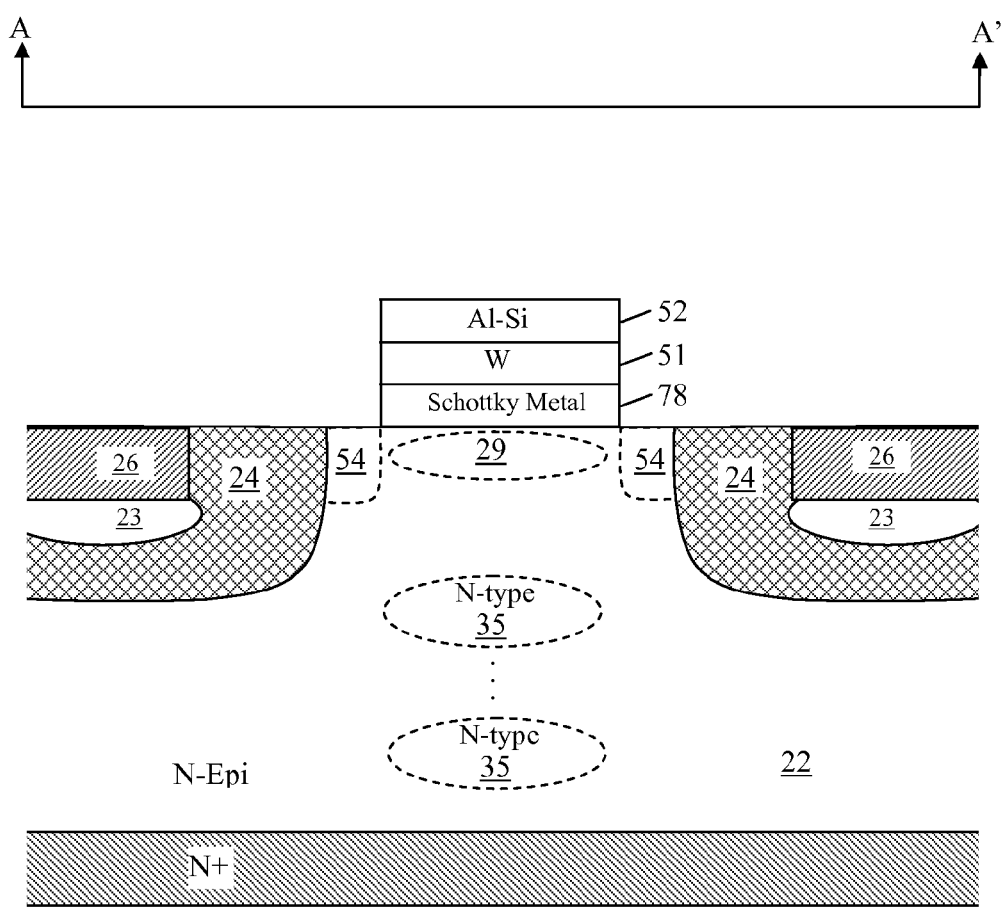
FIG. 9 is a cross-sectional view of the trench Schottky diode in FIG. 8 along the longitudinal line A-A' according to one embodiment of the present invention.

FIG. 8 is an isometric view of the trench Schottky diode according to a third alternate embodiment of the present invention. FIG. 9 is a cross-sectional view of the trench Schottky diode in FIG. 8 along the longitudinal line A-A' according to one embodiment of the present invention. Referring to FIGS. 8 and 9, a trench Schottky diode 70 is formed in substantially the same manner as trench Schottky diode 60 described above. More specifically, trench Schottky diode 70 is formed in a mesa 27 between two trenches 12b and 12c that are only partially filled with a trench conductor layer 13b and 13c. P-well regions 24 are formed interspersed in mesa 27 along the longitudinal axis of the mesa. Source contact plugs 26 and optional P+ body contact diffusion regions 23 are formed in the P-well regions 24. In the present embodiment, the Schottky metal layer 78 is formed as islands on the N-type epitaxial layer 22 in mesa 27. More specifically, the Schottky metal islands 78 are formed above the N-type epitaxial layer 22 in mesa 27 between adjacent P-well regions 24 and in an area surrounded by an edge termination diffusion region 54. Edge termination diffusion region 54 is a P-type region and is formed in the top surface of the N-type epitaxial layer 22 surrounding the Schottky junction. More specifically, edge termination diffusion region 54 is formed on the perimeter of the mesa 27 bounded by adjacent P-well regions 24. In one embodiment, edge termination diffusion region 54 is formed by P-type ion implantation into the N-Epitaxial layer 22. Edge termination diffusion region 54 has the effect of reducing the electrical field at the corners of the Schottky junction.

In embodiments of the present invention, Schottky diode 70 may further include a shallow compensation implant 29 and one or more deep pocket compensation implants 35, in the same manner as described above.

In the present embodiment, Schottky diode 70 includes source plugs 26 and P+ body contact diffusion regions 23 in the P-well regions 24. The source plugs 26 and the P+ body contact diffusion regions 23 are optional and one or both may be omitted in other embodiments of the present invention. Schottky diode 70 may be formed without any source plugs or P+ body contact regions in the P-well regions 24.

Figure 10:
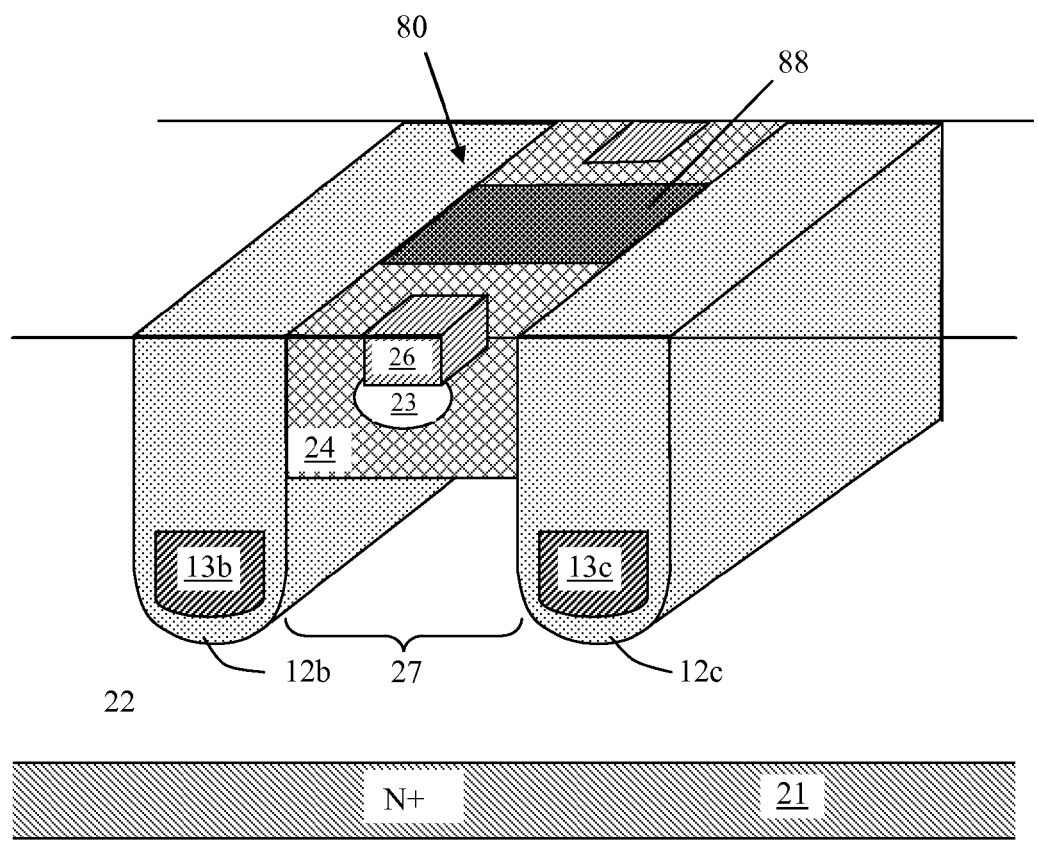
FIG. 10 is an isometric view of the trench Schottky diode according to a fourth alternate embodiment of the present invention.

FIG. 10 is an isometric view of the trench Schottky diode according to a fourth alternate embodiment of the present invention. Referring to FIG. 10, a trench Schottky diode 80 is formed in substantially the same manner as trench Schottky diode 60 described above. More specifically, trench Schottky diode 80 is formed in a mesa 27 between two trenches 12b and 12c that are only partially filled with a trench conductor layer 13b and 13c. Furthermore, P-well regions 24 are formed interspersed in mesa 27 along the longitudinal axis of the mesa and source plugs 26 and optional P+ body contact diffusion regions 23 are formed in the P-well regions 24. In the present embodiment, the Schottky metal layer 88 is formed as an island overlying the area of the N-type epitaxial layer in mesa 27 between adjacent P-well regions 24. The source plugs 26 may be electrically connected to the anode of the Schottky diode which can be in turn connected to the source of the trench MOSFET formed on the same semiconductor layer.

In the present embodiment, Schottky diode 80 includes source plugs 26 and P+ body contact diffusion regions 23 in the P-well regions 24. The source plugs 26 and the P+ body contact diffusion regions 23 are optional and one or both may be omitted in other embodiments of the present invention. Schottky diode 80 may be formed without any source plugs or P+ body contact regions in the P-well regions 24.

The above detailed descriptions are provided to illustrate specific embodiments of the present invention and are not intended to be limiting. Numerous modifications and variations within the scope of the present invention are possible. For example, in FIGS. 2, 3 and 10, the Schottky metal layer is shown as being extended across the entire width of the N-type epitaxial layer between the two adjacent trenches (12b, 12c). In other embodiments of the present invention, the Schottky metal layer may overlay only a portion of the width between the two trenches, as shown in FIGS. 4 and 6. Similarly, the Schottky metal layer in FIGS. 4 and 6 may be extended to cover the entire width of the semiconductor layer between the two adjacent trenches.

Furthermore, in the above-described embodiments, an N-type trench MOSFET device is described and the trench Schottky diode is formed over an N-type epitaxial layer. In other embodiments of the present invention, devices of the opposite polarity type may be formed by reversing the polarities of the semiconductor layer or substrate, the epitaxial layer and the various diffusion/implant regions. The present invention is defined by the appended claims.

We claim:

1. A method for forming a Schottky diode, comprising:
providing a semiconductor substrate of a first conductivity type;
providing a semiconductor layer of the first conductivity type on the semiconductor substrate, the semiconductor layer being lightly doped;
forming first and second trenches in the semiconductor layer;
forming a thin dielectric layer lining sidewalls of the first and second trenches;
forming a trench conductor layer in the first and second trenches, the trench conductor layer filling a portion of each of the first and second trenches and being the only one trench conductor layer in the first and second trenches;
forming a first dielectric layer in the first and second trenches to fill the remaining portions of the first and second trenches;
forming a Schottky metal layer on a top surface of the lightly doped semiconductor layer between the first trench and the second trench to form a Schottky junction, wherein the Schottky diode is formed with the Schottky metal layer as the anode and the lightly doped semiconductor layer between the first and second trenches as the cathode; and
forming an electrical connection between the trench conductor layer in each of the first and second trenches and the anode of the Schottky diode, the trench conductor layer in each of the first and second trenches being insulated by the first dielectric layer in the respective trenches and being physically isolated from the Schottky metal layer forming the anode of the Schottky diode.

2. The method of claim 1, wherein the first and second trenches each has a first trench depth, the first trench conductor layer extends up to about half or less than half of the first trench depth.

3. The method of claim 1, wherein forming a Schottky metal layer on a top surface of the lightly doped semiconductor layer between the first trench and the second trench to form a Schottky junction comprises:
forming the Schottky metal layer on the semiconductor layer overlaying a portion of the width or the entire width of the semiconductor layer from the first trench to the second trench.

4. The method of claim 1, further comprising:
forming a plurality of well regions of a second conductivity type in a top portion of the semiconductor layer between the first trench and the second trench, the plurality of well regions being spaced apart in a longitudinal direction parallel to the longitudinal axis of the first and second trenches,
wherein the Schottky metal layer is formed overlying the plurality of well regions and the semiconductor layer between the plurality of well regions.

5. The method of claim 4, wherein forming a Schottky metal layer on a top surface of the lightly doped semiconductor layer between the first trench and the second trench to form a Schottky junction comprises:
forming the Schottky metal layer on the semiconductor layer and the plurality of well regions overlaying a portion of the width or the entire width of the semiconductor layer and the well regions from the first trench to the second trench.

6. The method of claim 4, further comprising:
forming a contact plug in each of the plurality of well regions,
wherein the Schottky metal layer is formed overlying the plurality of well regions, the contact plugs formed in the plurality of well regions and the semiconductor layer between the plurality of well regions, the Schottky metal layer forming an ohmic contact with the contact plugs.

7. The method of claim 6, further comprising:
forming a contact diffusion region of the second conductivity type in each of the plurality of well regions underneath a respective contact plug.

8. The method of claim 6, wherein the Schottky metal layer is formed on the semiconductor layer, the plurality of well regions and the contact plugs formed in the plurality of well regions and covers a portion of the width or the entire width of the semiconductor layer and the well regions from the first trench to the second trench.

9. The method of claim 1, further comprising:
forming a shallow compensation implant region of a second conductivity type at the top surface of the semiconductor layer between the first and second trenches, the shallow compensation implant region being formed to adjust the forward bias voltage of the Schottky diode.

10. The method of claim 1, further comprising:
forming a deep pocket compensation implant region of a second conductivity type in the semiconductor layer between the first and second trenches and at a depth away from the top surface of the semiconductor layer, the deep pocket compensation implant region being formed to reduce leakage current of the Schottky diode.

11. The method of claim 1, further comprising:
forming a plurality of well regions of a second conductivity type in a top portion of the semiconductor layer between the first trench and the second trench, the plurality of well regions being spaced apart in a longitudinal direction parallel to the longitudinal axis of the first and second trenches,
wherein the Schottky metal layer is formed on a top surface of the semiconductor layer between the first trench and the second trench and overlies only the semiconductor layer between the plurality of well regions.

12. The method of claim 1, further comprising:
forming a plurality of well regions of a second conductivity type in a top portion of the semiconductor layer between the first trench and the second trench, the plurality of well regions being spaced apart in a longitudinal direction parallel to the longitudinal axis of the first and second trenches; and
forming an edge termination diffusion region of the second conductivity type in the semiconductor layer along a perimeter bounded by the first and second trenches and adjacent well regions,
wherein the Schottky metal layer is formed overlying the semiconductor layer in an area bounded by the edge termination diffusion region.

13. The method of claim 1, wherein the Schottky metal layer comprises a titanium nitride layer.

14. The method of claim 1, wherein the semiconductor layer comprises an epitaxial layer of the first conductivity type.

15. The method of claim 4, wherein the first conductivity type comprises N-type conductivity and the second conductivity type comprises P-type conductivity.

16. The method of claim 1, wherein the semiconductor substrate comprises a heavily doped semiconductor substrate of the first conductivity type.

17. A method for forming a semiconductor device comprising a field effect transistor and a Schottky diode, the method comprising:
  providing a semiconductor substrate of a first conductivity type;
  forming a semiconductor layer of the first conductivity type on the semiconductor substrate, the semiconductor layer being lightly doped;
  forming first, second and third trenches in the semiconductor layer;
  forming a thin dielectric layer lining sidewalls of the first, second and third trenches;
  forming a first trench conductor layer in the first, second and third trenches, the first trench conductor layer filling a portion of each of the first, second and third trenches and being the only one trench conductor layer in the first and second trenches;
  forming a first dielectric layer in the first and second trenches to fill the remaining portions of the first and second trenches;
  forming an inter-layer dielectric layer in the third trench above the first trench conductor layer;
  forming a second trench conductor layer in the third trench above the inter-layer dielectric layer, the second trench conductor layer extending from the inter-layer dielectric to near a top surface of the third trench;
  forming a first well region of a second conductivity type in a top portion of the semiconductor layer adjacent the third trench, the first well region extending to a depth near a bottom edge of the second trench conductor layer formed in the third trench;
  forming a heavily doped source region of the first conductivity type in the first well region adjacent to the sidewall of the third trench, wherein the field effect transistor is formed with the semiconductor substrate as a drain electrode, the second trench conductor layer in the third trench as the gate electrode, the first well region as the body region, the heavily doped source region as the source electrode, and the first trench conductor layer in the third trench as a gate shielding electrode;
  forming a Schottky metal layer on a top surface of the lightly doped semiconductor layer between the first trench and the second trench to form a Schottky junction, wherein the Schottky diode is formed with the Schottky metal layer as the anode and the lightly doped semiconductor layer between the first and second trenches as the cathode;
  forming an electrical connection between the first trench conductor layer in the third trench to the source electrode; and
  forming an electrical connection between the first trench conductor layer in each of the first and second trenches to the anode of the Schottky diode, the first trench conductor layer in each of the first and second trenches being insulated by the first dielectric layer in the respective trenches and being physically isolated from the Schottky metal layer forming the anode of the Schottky diode.

18. The method of claim 17, wherein the first, second and third trenches have a first trench depth, the first trench conductor layer extends up to about half or less than half of the first trench depth.

19. The method of claim 17, further comprising:
  forming a plurality of well regions of the second conductivity type in a top portion of the semiconductor layer between the first trench and the second trench, the plurality of well regions being spaced apart in a longitudinal direction parallel to the longitudinal axis of the first and second trenches,
  wherein the Schottky metal layer is formed overlying the plurality of well regions and the semiconductor layer between the plurality of well regions.

20. The method of claim 19, wherein the plurality of well regions have the same doping concentration and the same depth as the first well region.

21. The method of claim 19, further comprising:
  forming a contact plug in each of the plurality of well regions,
  wherein the Schottky metal layer is formed overlying the plurality of well regions, the contact plugs formed in the plurality of well regions and the semiconductor layer between the plurality of well regions, the Schottky metal layer forming an ohmic contact with the contact plugs.

22. The method of claim 21, further comprising:
  forming a contact diffusion regions of the second conductivity type in each of the plurality of well regions underneath a respective contact plug.

23. The method of claim 17, further comprising:
  forming a shallow diffusion region of the second conductivity type at the top surface of the semiconductor layer between the first and second trenches.

24. The method of claim 17, further comprising:
  forming a deep pocket diffusion region of the second conductivity type in the semiconductor layer between the first and second trenches and at a depth away from the top surface of the semiconductor layer.

25. The method of claim 17, wherein the semiconductor layer comprises an epitaxial layer of the first conductivity type.

26. The method of claim 17, wherein the first conductivity type comprises N-type conductivity and the second conductivity type comprises P-type conductivity.

27. The method of claim 17, wherein the semiconductor substrate comprises a heavily doped N-type semiconductor substrate.

* * * * *